(12) United States Patent
Wada

(10) Patent No.: US 9,362,465 B2
(45) Date of Patent: Jun. 7, 2016

(54) METHOD OF MANUFACTURING LIGHT EMITTING DEVICE

(71) Applicant: TOYODA GOSEI CO., LTD., Kiyosu-shi (JP)

(72) Inventor: Satoshi Wada, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 14/631,758

(22) Filed: Feb. 25, 2015

(65) Prior Publication Data

US 2015/0280081 A1  Oct. 1, 2015

(30) Foreign Application Priority Data

Mar. 28, 2014  (JP) ................................ 2014-069909

(51) Int. Cl.
*H01L 33/50* (2010.01)
*H01L 33/00* (2010.01)
*H01L 33/20* (2010.01)
*H01L 33/48* (2010.01)
*H01L 33/60* (2010.01)
*H01L 33/58* (2010.01)

(52) U.S. Cl.
CPC .......... *H01L 33/505* (2013.01); *H01L 33/0054* (2013.01); *H01L 33/0095* (2013.01); *H01L 33/20* (2013.01); *H01L 33/486* (2013.01); *H01L 33/58* (2013.01); *H01L 33/60* (2013.01); *H01L 2933/0033* (2013.01); *H01L 2933/0041* (2013.01); *H01L 2933/0058* (2013.01); *H01L 2933/0091* (2013.01)

(58) Field of Classification Search
CPC ...................... H01L 33/502; H01L 2933/0041
USPC ................................ 257/98, E33.061; 438/29
See application file for complete search history.

(56) References Cited

U.S. PATENT DOCUMENTS

| 2012/0146077 A1* | 6/2012 | Nakatsu ................ H01L 33/486 257/98 |
| 2013/0026527 A1 | 1/2013 | Ichikawa |
| 2013/0221389 A1* | 8/2013 | Yamamuro ............ H01L 33/50 257/98 |

FOREIGN PATENT DOCUMENTS

| JP | 5326705 B2 | 10/2013 |
| WO | WO 2011-126000 A1 | 10/2011 |

* cited by examiner

*Primary Examiner* — Julio J Maldonado
*Assistant Examiner* — Hajar Kolahdouzan
(74) *Attorney, Agent, or Firm* — McGinn IP Law Group, PLLC.

(57) ABSTRACT

In a method of manufacturing a light emitting device, a luminescent color conversion member made of a translucent material including phosphors is directly fixed to light emitting surface side of light emitting elements in a light emitting element group, and a stack of the light emitting element group and the luminescent color conversion member is divided into a plurality of chips. In each of the light emitting elements, a piece of the luminescent color conversion member is directly fixed to the light emitting surface of the light emitting element.

20 Claims, 11 Drawing Sheets

POLISHING

METHOD OF MANUFACTURING LIGHT EMITTING DEVICE

CROSS REFERENCE TO RELATED APPLICATIONS

This application claims the benefit of Japanese Patent Application (No. P2014-069909) filed on Mar. 28, 2014, the contents of which are incorporated herein by reference.

BACKGROUND OF THE INVENTION

1. Field of the Invention

The present invention relates to a method of manufacturing a light emitting device and, more particularly, to a method of manufacturing a light emitting device including a light emitting element, a luminescent color conversion member, a reflective member and a mounting substrate.

2. Description of the Related Art

Patent Document 1 discloses a light emitting device where a light emitting element and a light transmitting member containing phosphors are bonded by a light guide member made of adhesive and the side surfaces of the light emitting element and the light transmitting member are covered by a coating material containing a light reflective material.

Further, Patent Document 1 also discloses a light emitting device where a plurality of light emitting elements that is spaced apart from each other is bonded to a light-receiving surface side of one light transmitting member through a light guide member.

Patent Document 2 discloses a light emitting device where a light emitting element is bonded to a wavelength conversion member containing phosphors. Here, the light emitting element has a first region and a second region from the wavelength conversion member side. The wavelength conversion member has a third region and a fourth region from the light emitting element side. The first region has an irregular atomic arrangement, as compared to the second region. The third region has an irregular atomic arrangement, as compared to the fourth region. The first region is directly bonded to the third region.

Further, Patent Document 2 discloses a surface activated bonding method where the bonding surfaces of the light emitting element and the wavelength conversion member are sputter-etched by an ion beam or plasma or the like, both bonding surfaces are activated, and then the light emitting element and the wavelength conversion member are directly bonded at the bonding surfaces.

Meanwhile, it is difficult to bond the light emitting element including a sapphire substrate and the wavelength conversion member made of a glass by the surface activated bonding method. Accordingly, in Patent Document 2, aluminum oxide is formed as a bonding member on the glass surface by a sputtering or the like and the aluminum oxide and the sapphire substrate are bonded by the surface activated bonding method.

Patent Document 1: JP-B-5326705
Patent Document 2: WO2011/126000

In a light emitting device including a light emitting element and a luminescent color conversion member (wavelength conversion member) containing phosphors, a primary light (blue light) is an excitation light emitted from the light emitting element and a portion of the primary light is excited by the phosphors in the luminescent color conversion member to generate a luminescent color-converted (wavelength-converted) secondary light (yellow light). The primary light and the secondary light are mixed to generate a mixed-color light (white light). The mixed-color light is emitted to the outside from the light emitting device through the luminescent color conversion member.

Therefore, light energy that is not converted during the luminescent color conversion becomes thermal energy to cause the phosphors to generate heat. Accordingly, the temperature of the phosphors is raised and the efficiency of the luminescent color conversion is lowered. Further, the components of the light emitting device are deteriorated due to the heat-generation. Accordingly, it is necessary to efficiently dissipate the heat generated by the phosphors.

However, in the technique disclosed in Patent Document 1, the light emitting element and the light transmitting member (luminescent color conversion member) are bonded by the light guide member. Further, the light guide member made of an adhesive has a low thermal conductivity. Accordingly, the heat transfer to the light emitting element from the light transmitting member is blocked by the light guide member.

As a result, there are problems that the temperature of phosphors contained in the light transmitting member is raised, the efficiency of luminescent color conversion is lowered, and the components of the light emitting device are deteriorated due to the heat-generation.

Further, in the technique disclosed in Patent Document 1, the light transmitting member is mounted by being placed on the upper surface of the light emitting element through the light guide member. However, from the viewpoint of the mounting accuracy, it is difficult to cause the size of the light emitting element to be equal to that of the light transmitting member, as seen in a plan view. Further, it is necessary to cause the size of the light transmitting member to be greater than that of the light emitting element, as seen in a plan view.

Therefore, a cover portion covering the upper surface of the light emitting element and an eaves-like portion extending from the cover portion are formed in the light transmitting member.

As a result, in addition to the light emitted through the light transmitting member from the upper surface of the light emitting element, the light emitted through the eaves-like portion of the light transmitting member from the side surface of the light emitting element also occurs.

Then, the light emitted through the light transmitting member from the upper surface of the light emitting element is a white light whereas the light emitted through the eaves-like portion of the light transmitting member from the side surface of the light emitting element is a yellow light. Accordingly, there is a possibility that the in-plane distribution of chromaticity in the front surface of the light transmitting member becomes uneven.

Further, in the technique disclosed in Patent Document 1, one light transmitting member also covers gaps between the pluralities of light emitting elements.

Therefore, the light emitted through the light transmitting member from the upper surface of each light emitting element is a white light whereas the light emitted through the gaps and then through the light transmitting member from the side surface of each light emitting element is a yellow light. Accordingly, there is a possibility that the in-plane distribution of chromaticity in the front surface of the light transmitting member becomes uneven.

Further, when there is a variation in the thickness (height) of each light emitting element, for each light emitting element, a variation occurs in distances between the upper surface of each light emitting element and one light transmitting member. Accordingly, a temperature distribution occurs in the light transmitting member and cracks due to thermal stress are generated in the light transmitting member. Accordingly, there is a possibility that the light transmitting member is broken.

In the technique disclosed in Patent Document 2, the atomic arrangement in the bonding surface between the light emitting element and the wavelength conversion member is irregular. Accordingly, a compositional change occurs in the surface state of the bonding surface. As a result, optical characteristics also change in accordance with the compositional change.

Therefore, the emitted light of the light emitting element is unnecessarily reflected or absorbed by the bonding surface and it is thus difficult to cause the emitted light of the light emitting element to be smoothly incident on the wavelength conversion member. Accordingly, there is a problem that the light extraction efficiency is lowered.

Further, in the technique disclosed in Patent Document 2, the emitted light of the light emitting element is reflected or absorbed by a bonding member when the bonding member is formed between the light emitting element and the wavelength conversion member. Accordingly, it is difficult to cause the emitted light of the light emitting element to be smoothly incident on the wavelength conversion member.

SUMMARY OF THE INVENTION

The present invention has been made to solve the above problems and an object thereof is to provide a manufacturing method of a light emitting device, which is capable of preventing the damage of the luminescent color conversion member due to heat, effectively dissipating the heat generated by the luminescent color conversion member, and achieving a uniform in-plane distribution of chromaticity in the front surface of the luminescent color conversion member.

The present inventors have intensively studied in order to solve the above problems and reached each aspect of the present invention as described below.

<First Aspect>

A first aspect provides a method of manufacturing a light emitting device, the method comprising:

a first process for manufacturing a plate-like light emitting element group where a plurality of light emitting elements are arranged in a plane direction;

a second process for directly fixing a luminescent color conversion member to a light emitting surface side of the light emitting elements in the light emitting element group, the luminescent color conversion member being made of a translucent material including phosphors;

a third process for dividing, a stack of the light emitting element group and the luminescent color conversion member, into a plurality of chips to manufacture the light emitting elements, wherein in each of the light emitting elements, a piece of the luminescent color conversion member is directly fixed to a light emitting surface of the light emitting element;

a fourth process for mounting the light emitting element on a front surface of a mounting substrate;

a fifth process for forming a reflective member including a light reflective material on the front surface of the mounting substrate, and surrounding and covering the light emitting element and the piece of the luminescent color conversion member by the reflective member; and a sixth process for manufacturing the light emitting device by polishing the reflective member to expose a front surface of the piece of the luminescent color conversion member and causing the front surface of the piece of the luminescent color conversion member to be flush with a front surface of the reflective member.

In the first aspect, a primary light (blue light) is an excitation light emitted from the light emitting element and a portion of the primary light is excited by the phosphors in the luminescent color conversion member to generate a luminescent color-converted (wavelength-converted) secondary light (yellow light). The primary light and the secondary light are mixed to generate a mixed-color light (white light). The mixed-color light is emitted to the outside from the light emitting device through the luminescent color conversion member.

Therefore, light energy that is not converted during the luminescent color conversion becomes thermal energy to cause the phosphors to generate heat. Accordingly, the temperature of the phosphors is raised and the efficiency of the luminescent color conversion is lowered. Further, the components of the light emitting device are deteriorated due to the heat-generation. Accordingly, it is necessary to efficiently dissipate the heat generated by the phosphors.

In the second process of the first aspect, the luminescent color conversion member made of the translucent material containing the phosphors is directly fixed to the light emitting surface side of the light emitting elements in the light emitting element group.

Further, in the third process, the stack of the light emitting element group and the luminescent color conversion member is divided into a plurality of chips. In each of the light emitting elements, a piece of the luminescent color conversion member is directly fixed to the light emitting surface of the light emitting element.

Therefore, in the first aspect, the heat transfer to the light emitting element from the luminescent color conversion member is not blocked. Accordingly, the heat generated by the phosphors contained in the luminescent color conversion member can be effectively dissipated through the light emitting element. As a result, in addition to improving the efficiency of the luminescent color conversion by suppressing the temperature rise of the phosphors, it is possible to prevent the components of the light emitting device from being deteriorated by the heat-generation.

Further, in the third process of the first aspect, the size of the light emitting element is the same as that of the luminescent color conversion member, as seen in a plan view. Accordingly, the in-plane distribution of chromaticity in the front surface (light emitting surface of the light emitting device) of the luminescent color conversion member can be made uniform.

Further, in the first aspect, one luminescent color conversion member covers only the upper surface of one light emitting element. Accordingly, a temperature distribution does not occur in the luminescent color conversion member even when there is a variation in the thickness (height) of each light emitting element. In this way, the cracks due to the thermal stress can be prevented from occurring in the luminescent color conversion member.

Furthermore, by the fifth process and the sixth process, the reflective member is made in close contact with the side surface of the luminescent color conversion member. The heat generated by the phosphors contained in the luminescent color conversion member can be also dissipated from the reflective member, in addition to being dissipated from the light emitting element. Accordingly, it is possible to further improve the above operation/effects.

<Second Aspect>

A second aspect provides method of manufacturing a light emitting device, the method comprising:

a first process for manufacturing a plate-like light emitting element group where a plurality of light emitting elements are arranged in a plane direction;

a second process for directly fixing a luminescent color conversion member to a light emitting surface side of the light emitting elements in the light emitting element group, the luminescent color conversion member being made of a translucent material including phosphors;

a third process for directly fixing a light scattering member to the luminescent color conversion member, the light scattering member being made of a translucent material including a light scattering material;

a fourth process for dividing, a stack of the light emitting element group, the luminescent color conversion member and the light scattering member, into a plurality of chips to manufacture the light emitting elements, wherein in each of the light emitting elements, a piece of the luminescent color conversion member and a piece of the light scattering member are directly fixed in this order to a light emitting surface of the light emitting element;

a fifth process for mounting the light emitting element on a front surface of a mounting substrate;

a sixth process for forming a reflective member including a light reflective material on the front surface of the mounting substrate, and surrounding and covering the light emitting element, the piece of the luminescent color conversion member and the piece of the light scattering member by the reflective member; and a seventh process for manufacturing the light emitting device by polishing the reflective member to expose a front surface of the piece of the luminescent color conversion member and causing the front surface of the piece of the luminescent color conversion member to be flush with the front surface of the piece of the light scattering member.

In the second aspect, the light scattering member is provided to cover the luminescent light conversion member. Accordingly, in addition to the above operation/effects of the first aspect, the in-plane distribution of chromaticity in the front surface (light emitting surface of the light emitting device) of the light scattering member can be made uniform. As a result, it is possible to further improve the effect of suppressing the chromaticity unevenness in the light emitting surface of the light emitting device.

<Third Aspect>

A third aspect according to the first aspect or the second aspect, provide that, the reflective member has a double layer structure where a light reflective layer made of a translucent material including a light reflective material and a light absorbing layer made of a translucent material including a light absorbing material are stacked, the light reflective layer surrounds the light emitting element so as be in close contact with a side surface of the light emitting element, and the light absorbing layer surrounds the piece of the luminescent color conversion member so as to be in close contact with a side surface of the piece of the luminescent color conversion member.

In the third aspect, unwanted stray light other than the light emitted in a direction perpendicular to the light emitting surface of the light emitting element is absorbed by the light absorbing layer of the reflective member. Accordingly, the light can be emitted only in the direction perpendicular to the light emitting surface of the light emitting element, so that it is possible to realize the light emitting device suitable for a headlamp of a vehicle, especially.

DETAILED DESCRIPTION OF THE EXEMPLARY EMBODIMENTS

Figure 1A:
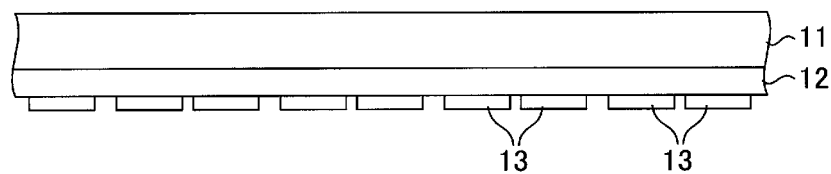
FIGS. 1A to 1D are longitudinal sectional views for explaining a manufacturing method of light emitting devices 10, 20 of first and second embodiments of the present invention.
Figure 1B:
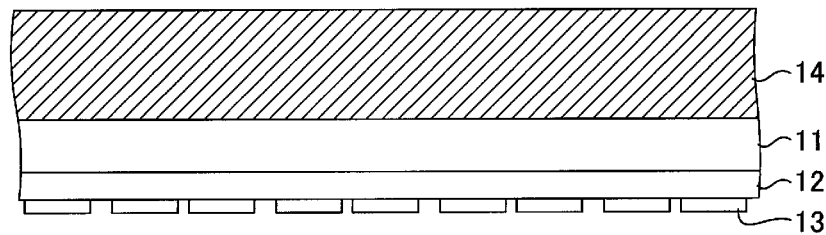
Figure 1C:
Figure 1C:
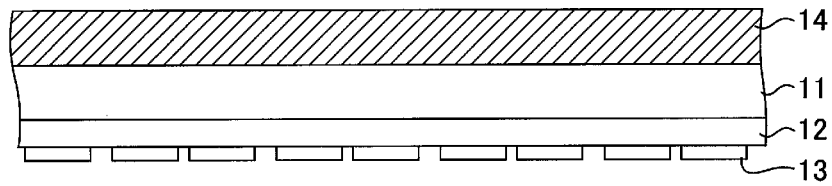
Figure 1D:
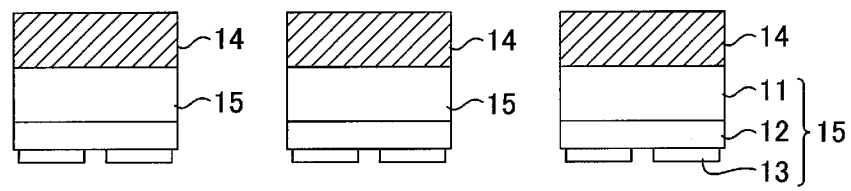
Figure 2A:
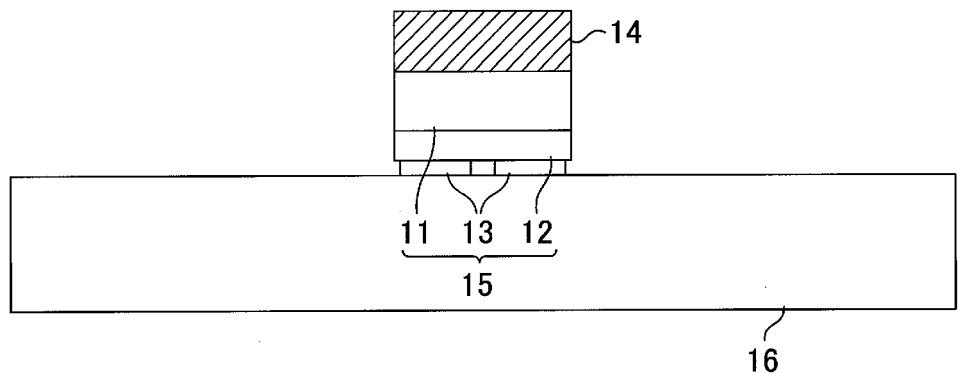
FIGS. 2A and 2B are longitudinal sectional views for explaining a manufacturing method of light emitting devices 10, 30 of first and third embodiments of the present invention.
Figure 2B:
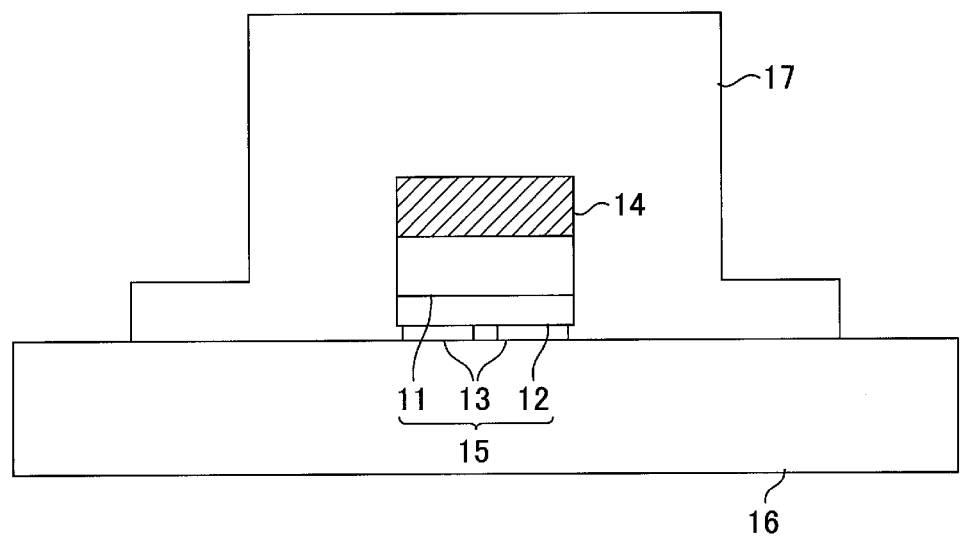

Hereinafter, respective illustrative embodiments of the present invention will be described with reference to the drawings. In addition, in the respective illustrative embodiments, the same constituent parts and components are denoted by the same reference numerals and a duplicated description thereof will be omitted.

Further, in respective drawings, in order to simplify the description, the size, shape and arrangement of the components in the respective illustrative embodiments are schematically shown in an exaggerated manner. In addition, the size, shape and arrangement of the components may be different from the actual.

First Embodiment

A manufacturing method of a light emitting device 10 according to a first embodiment will be described with reference to FIG. 1A to FIG. 3.

Process 1 (see FIG. 1A): A semiconductor layer (semiconductor lamination portion) 12 constituting a light emitting device structure is formed on the entire surface on a rear side of a plate-like crystal growth substrate (mounting substrate) 11. A plurality of electrodes 13 is formed on the semiconductor layer 12. Fine irregularities (not shown) for scattering the emitted light are formed on the entire surface on a front surface side (light emitting surface side) of the crystal growth substrate 11.

Meanwhile, the electrodes 13 constitute an anode-side electrode and a cathode-side electrode of an LED (Light Emitting Diode) chip 15 (to be described later).

The crystal growth substrate 11 is made of, for example, a gallium nitride substrate, a sapphire substrate, a silicon carbide substrate and the like.

Further, in order to form the fine irregularities on the entire surface on the front surface of the crystal growth substrate 11, various surface roughening processes (e.g., a pressing process, a sandblasting process, an etching process, etc.) can be performed. The fine irregularities may be omitted.

Process 2 (see FIG. 1B): Without using an adhesive, the luminescent color conversion member (wavelength conversion member) 14 is directly fixed to the entire surface on the light emitting surface side of the crystal growth substrate 11.

The luminescent color conversion member 14 is formed by a translucent material (e.g., a sintered body of a thermoplastic resin material such as a glass, an acrylic-based resin and a nylon-based resin, a thermosetting resin material such as an epoxy-based resin and a silicon-based resin, and a transparent inorganic material such as a sol-gel glass and alumina, etc.). The translucent material contains phosphors for converting the luminescent color of the emitted light of the LED chip 15.

Meanwhile, the luminescent color conversion member 14 may have a multilayer structure formed by laminating a plurality of layers containing phosphors whose light emitting wavelength is different from each other.

A method of directly fixing the luminescent color conversion member 14 to the crystal growth substrate 11 can be properly selected, depending on the translucent material of forming the luminescent color conversion member 14.

When the luminescent color conversion member 14 is made of a glass or a thermoplastic resin material, a plate-like glass or thermoplastic resin material can be thermally pressed to the crystal growth substrate 11.

When the luminescent color conversion member 14 is made of a thermosetting resin material, various coating methods (e.g., an electrostatic coating method, a spin coating method, a screen printing method, etc.) can be used to coat a liquid-phase thermosetting resin material on the crystal growth substrate 11. Then, the thermosetting resin material can be cured.

When the luminescent color conversion member 14 is made of a sol-gel glass, various coating methods can be used to coat a liquid-phase sol-gel glass forming material (e.g., metal alkoxide such as tetraethoxysilane, etc.) on the crystal growth substrate 11. Then, the forming material is hydrolyzed and then subjected to condensation polymerization, thereby obtaining a sol. Subsequently, water is removed from the sol to obtain a gel. The gel is sintered and vitrified. In this way, the sol-gel glass can be formed.

Figure 10A:
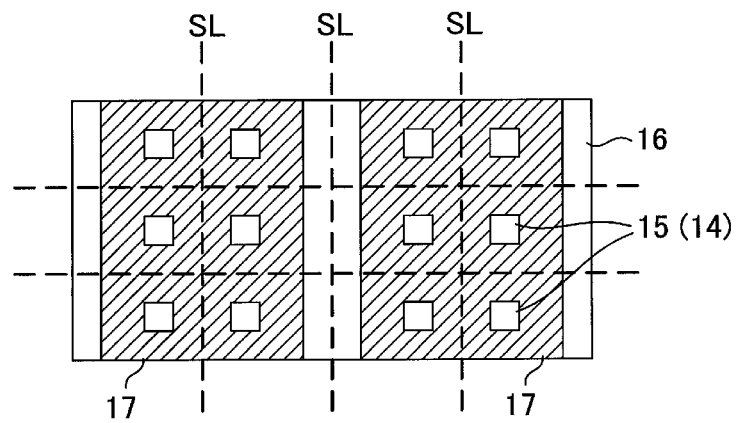
FIG. 10A and FIG. 10B are plan views for explaining a manufacturing method of the light emitting device 40 of the fifth embodiment of the present invention.

Process 3 (see FIG. 10): In order to cause the light emitting device 10 to have a desired chromaticity, the luminescent color conversion member 14 is polished to a desired thickness.

Process 4 (see FIG. 1D): The stack of the crystal growth substrate 11, the semiconductor layer 12 and the luminescent color conversion member 14 is divided and segmented into a plurality of chips by a scribe dicing. In this way, the LED chips 15 are manufactured. In each of the LED chips 15, a piece of the luminescent color conversion member 14 is directly fixed to the light emitting surface (upper surface).

The LED chip 15 includes the crystal growth substrate 11, the semiconductor layer 12 and the electrodes 13. The semiconductor layer 12 is formed at the opposite surface side of the light emitting surface of the crystal growth substrate 11 and constitutes a light emitting device structure. The electrodes 13 are formed on the semiconductor layer 12 and constitute an anode electrode and a cathode electrode of the LED chip 15.

Process 5 (see FIG. 2A): The LED chip 15 is mounted/carried at a side of the front surface of the mounting substrate 16.

For example, the mounting substrate 16 is formed by a substrate made of a bulk material of an insulating material (e.g., a ceramic material such as aluminum nitride, a synthetic resin material, etc.) or a substrate where an insulating layer is provided on a front face of a metallic material (e.g., an aluminum alloy, a pure copper, a copper-based alloy, a laminated material of copper/molybdenum/copper, etc.), or the like.

The LED chip 15 is a face-down element where the electrodes 13 are formed on a rear side and the rear side is mounted/carried on the mounting substrate 16.

The electrodes 13 of the LED chip 15 are electrically connected and fixedly bonded to a wiring layer (not shown) formed at the front surface side of the mounting substrate 16 using various bonding methods (e.g., a soldering, a stud bump bonding, a metallic fine particle bonding, an anodic bonding, a surface activation bonding, a bonding using an anisotropic conductive adhesive, etc.).

Meanwhile, an external electrode (not shown) is provided in the mounting substrate 16. The external electrode is connected to a connection terminal of an external power source. The mounting substrate may be a front surface-side wiring drawer type or a rear-side conduction type.

In the front surface-side wiring drawer type, the external electrode is formed at the front surface side of the mounting substrate 16.

In the rear-side conduction type, the external electrode is formed on a rear side of the mounting substrate 16. The external electrode and the wiring pattern are connected to each other through a via hole that is formed through the mounting substrate 16.

Process 6 (see FIG. 2B): The reflective member 17 is formed on the front surface of the mounting substrate 16.

The reflective member 17 surrounds and covers the LED chip 15 and the luminescent color conversion member 14. The reflective member 17 is in close contact with the side surfaces of the LED chip 15 and the luminescent color conversion member 14. The reflective member 17 covers the upper surface of the luminescent color conversion member 14.

The reflective member 17 is formed by a translucent material (e.g., a glass, a thermoplastic resin material, a thermosetting resin material, a sol-gel glass, etc.) containing a light reflective material (e.g., silicon oxide, titanium oxide, etc.) for reflecting the emitted light of the LED chip 15. The reflective member 17 has an insulating property.

A method of forming the reflective member 17 can be properly selected, depending on the translucent material forming the reflective member 17.

Here, the formation temperature of the reflective member 17 needs to be equal to or less than the formation temperature of the luminescent color conversion member 14 so that a process of forming the reflective member 17 does not adversely affect the luminescent color conversion member 14.

When the reflective member 17 is made of a glass or thermoplastic resin material, the plate-like glass or thermoplastic resin material can be thermally pressed to the LED chip 15 and the mounting substrate 16.

At this time, the reflective member 17 may be formed in a suitable shape by providing a recess having a predetermined shape in a press die (not shown) of a press machine.

When the reflective member 17 is made of a thermosetting resin material, various coating methods (e.g., an electrostatic coating method, a screen printing method, etc.) can be used to coat a liquid-phase thermosetting resin material on the LED chip 15 and the mounting substrate 16. Then, the thermosetting resin material can be cured.

When the reflective member 17 is made of a sol-gel glass, various coating methods can be used to coat a liquid-phase sol-gel glass forming material on the LED chip 15 and the mounting substrate 16. Then, the sol-gel glass can be formed in the manner described above.

Process 7 (see FIG. 3): The reflective member 17 is polished to expose the front surface of the luminescent color conversion member 14. Then, the front surface of the luminescent color conversion member 14 is flush with the front surface of the reflective member 17. In this way, the light emitting device 10 is completed.

When polishing the reflective member 17, an external force is applied to the LED chip 15. Accordingly, there is a possibility that the position deviation of the LED chip 15 from the mounting substrate 16 occurs. In order to prevent this possibility, it is preferable to firmly fix and hold the LED chip 15 by forming the reflective member 17 surrounding the LED chip 15 by a hard material (e.g., a glass, etc.).

Further, the light emitting device 10 may be adjusted to have a desired chromaticity by polishing the luminescent color conversion member 14 to a predetermined thickness, similarly to Process 3 (see FIG. 10), simultaneously with the polishing of the reflective member 17.

In the case of simultaneously polishing the reflective member 17 and the luminescent color conversion member 14, it is preferable to form the reflective member 17 and the luminescent color conversion member 14 by the same translucent material. By doing so, the reflective member 17 and the luminescent color conversion member 14 are uniformly polished so that the front surface of the luminescent color conversion member 14 is flush with the front surface of the reflective member 17.

Further, the adhesion of each member 14, 17 is improved when the reflective member 17 and the luminescent color conversion member 14 are formed by the same translucent material. Accordingly, it is possible to prevent each member 14, 17 from being separated at the interface thereof during the polishing of each member 14, 17.

Operation/Effect of First Embodiment

In the light emitting device 10, a primary light (blue light) is an excitation light emitted from the LED chip 15 (light emitting element) and a portion of the primary light is excited by the phosphors in the luminescent color conversion member 14 to generate a luminescent color-converted (wavelength-converted) secondary light (yellow light). The primary light and the secondary light are mixed to generate a mixed-color light (white light). The mixed-color light is emitted to the outside through the luminescent color conversion member 14.

Therefore, light energy that is not converted during the luminescent color conversion becomes thermal energy to cause the phosphors to generate heat. Accordingly, the temperature of the phosphors is raised and the efficiency of the luminescent color conversion is lowered. Further, the components of the light emitting device are deteriorated due to the heat-generation. Accordingly, it is necessary to efficiently dissipate the heat generated by the phosphors.

In Process 2 of the first embodiment, the luminescent color conversion member 14 made of the translucent material containing the phosphors is directly fixed to the light emitting surface side of the crystal growth substrate 11.

Further, in Process 4 of the first embodiment, the stack of the crystal growth substrate 11, the semiconductor layer 12 and the luminescent color conversion member 14 is divided into a plurality of chips. In this way, the LED chips 15 are manufactured. In each of the LED chips, a piece of the luminescent color conversion member 14 is directly fixed to the light emitting surface of the crystal growth substrate 11.

Therefore, in the light emitting device 10, the heat transfer to the LED chip 15 from the luminescent color conversion member 14 is not blocked. Accordingly, the heat generated by the phosphors contained in the luminescent color conversion member 14 can be effectively dissipated through the LED chip 15. As a result, in addition to improving the efficiency of the luminescent color conversion by suppressing the temperature rise of the phosphors, it is possible to prevent the components (the luminescent color conversion member 14, the LED chip 15, the reflective member 17, etc.) of the light emitting device 10 from being deteriorated by the heat-generation.

Further, in Process 4 of the first embodiment, the size of the LED chip 15 is the same as that of the luminescent color conversion member 14, as seen in a plan view. Accordingly, the in-plane distribution of chromaticity in the front surface (light emitting surface of the light emitting device 10) of the luminescent color conversion member 14 can be made uniform.

Further, in the light emitting device 10, one luminescent color conversion member 14 covers only the upper surface of one LED chip 15. Accordingly, a temperature distribution does not occur in the luminescent color conversion member 14 even when there is a variation in the thickness (height) of each LED chip 15. In this way, the cracks due to the thermal stress can be prevented from occurring in the luminescent color conversion member 14.

Furthermore, by Process 5 and Process 6 of the first embodiment, the reflective member 17 is made in close contact with the side surface of the luminescent color conversion member 14. The heat generated by the phosphors contained in the luminescent color conversion member 14 can be also dissipated from the reflective member 17, in addition to being dissipated from the LED chip 15. Accordingly, it is possible to further improve the above operation/effect.

Second Embodiment

Figure 4A:
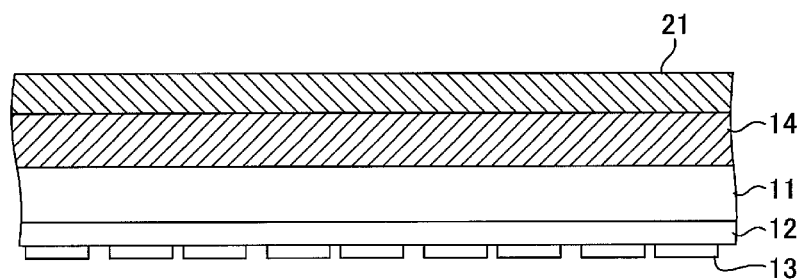
FIGS. 4A to 4C are longitudinal sectional views for explaining the manufacturing method of the light emitting device 20.
Figure 4B:
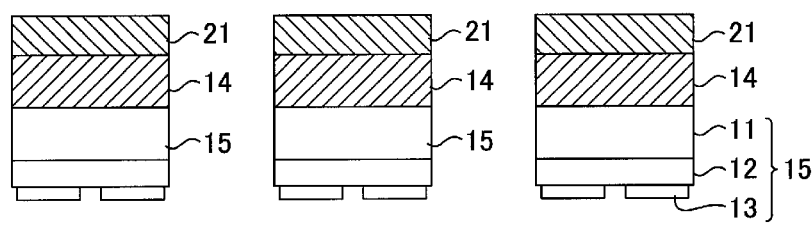
Figure 4C:
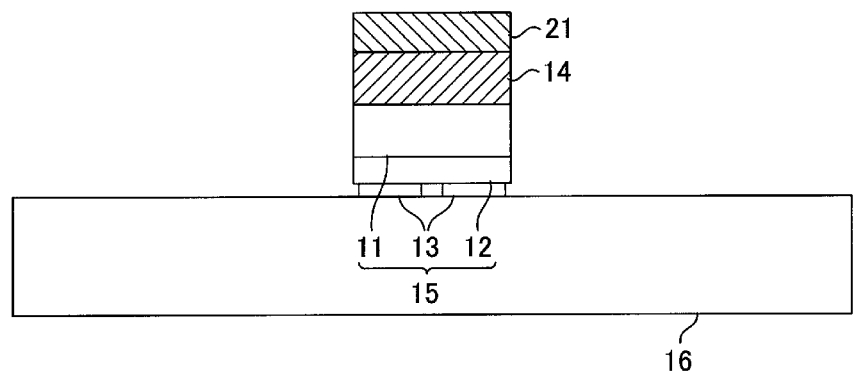
Figure 5A:
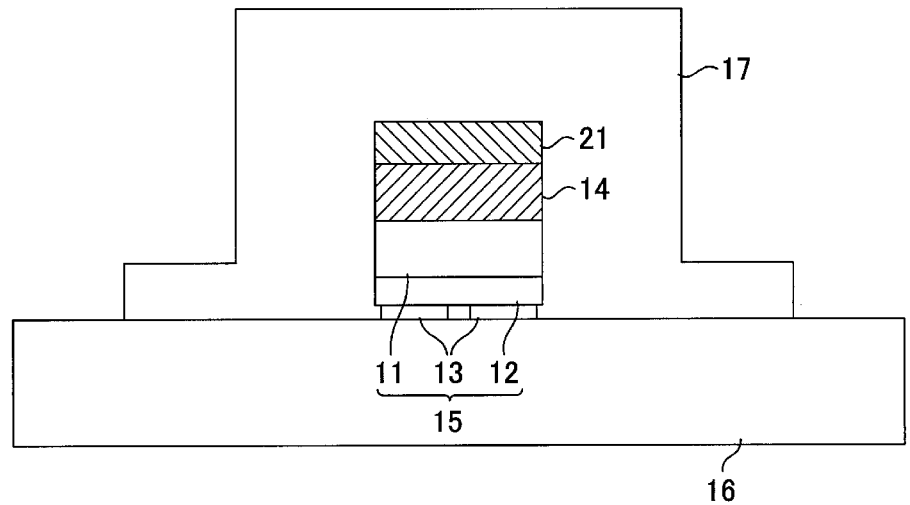
FIGS. 5A and 5B are longitudinal sectional views for explaining the manufacturing method of the light emitting device 20.
Figure 5B:
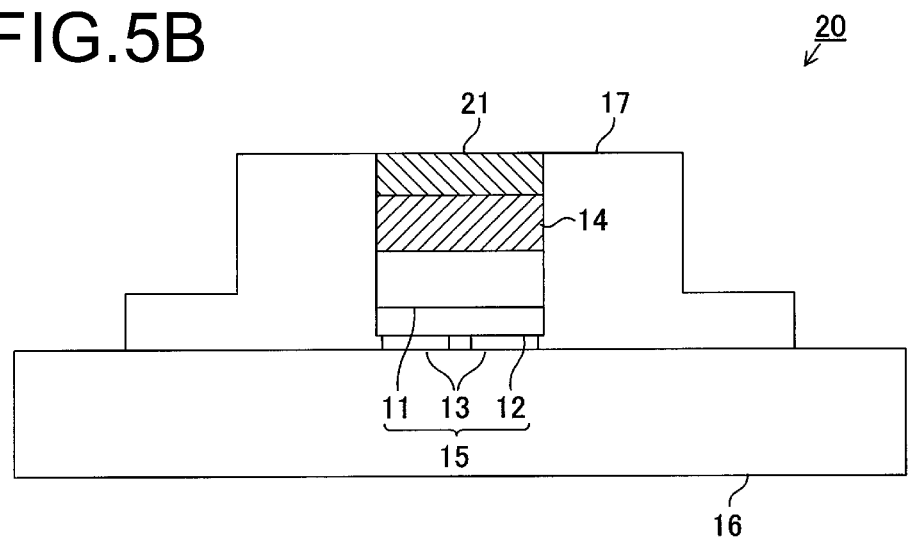
Figure 6A:
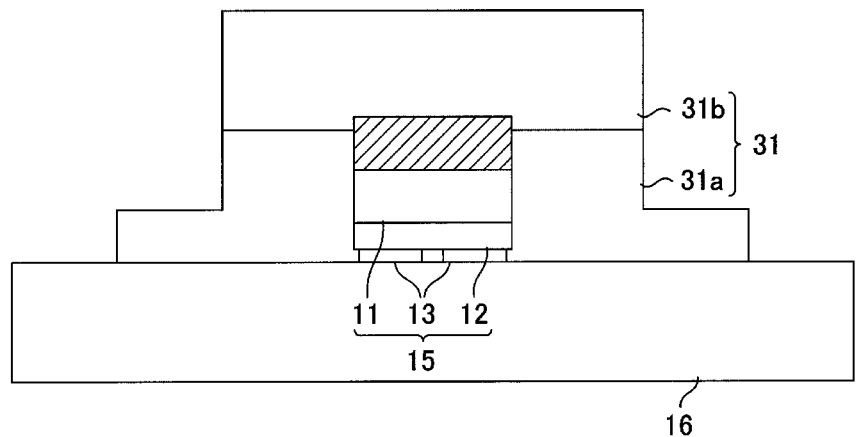
FIGS. 6A and 6B are longitudinal sectional views for explaining the manufacturing method of the light emitting device 30.
Figure 6B:
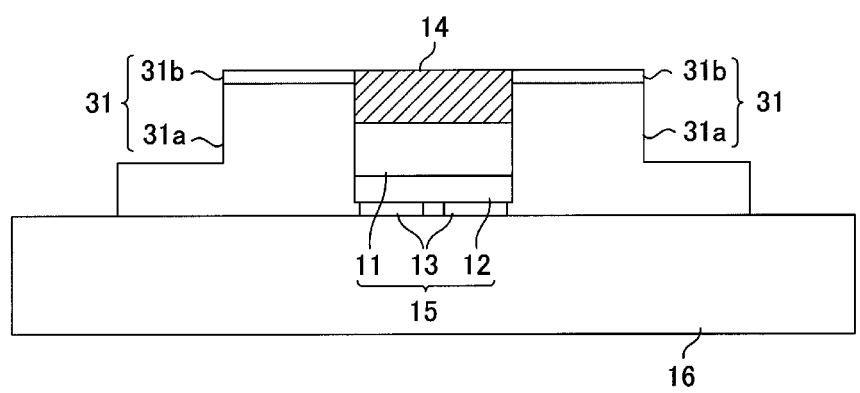
Figure 7A:
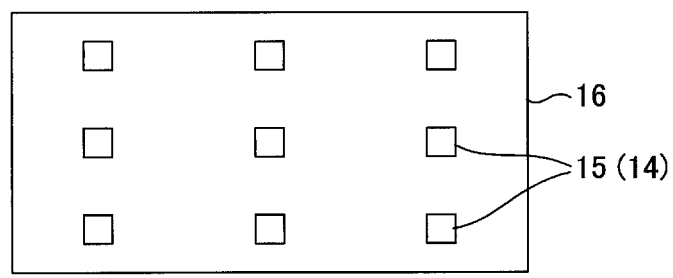
FIGS. 7A to 7C are plan views for explaining a manufacturing method of a light emitting device 10 of a fourth embodiment of the present invention.
Figure 7B:
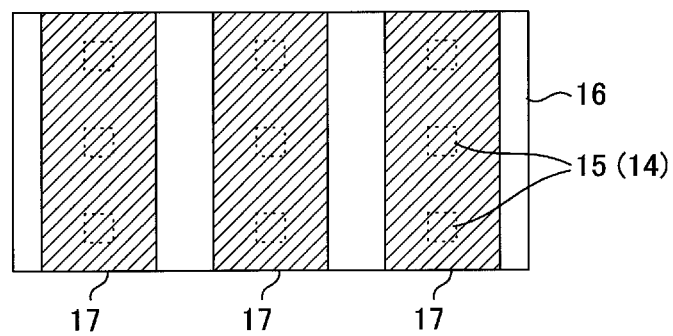
Figure 7C:
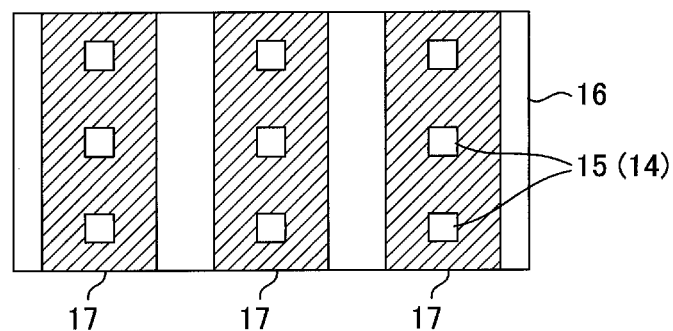
Figure 8A:
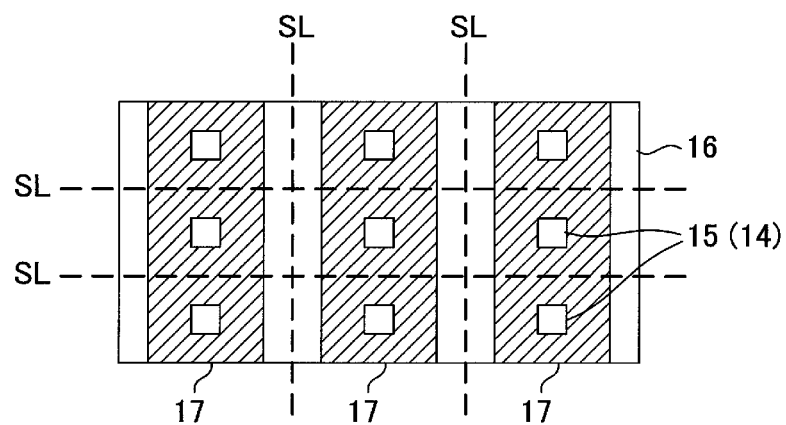
FIGS. 8A and 8B are plan views for explaining a manufacturing method of the light emitting device 10 of the fourth embodiment.
Figure 8B:
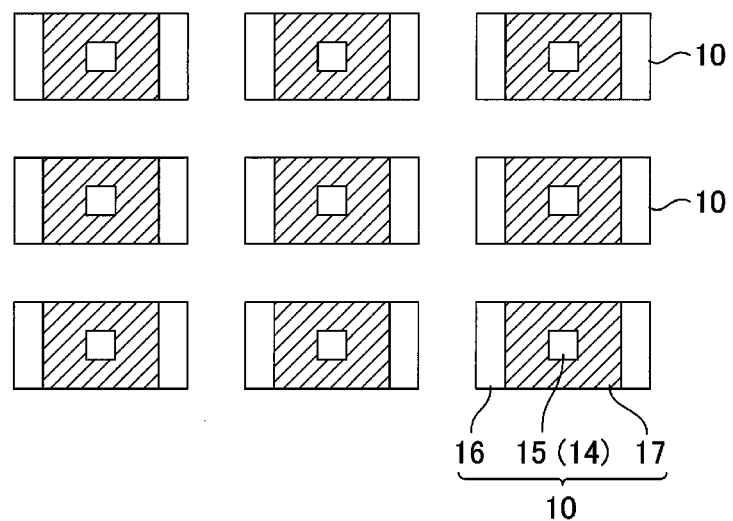

A manufacturing method of a light emitting device 20 of a second embodiment will be described with reference to FIG. 1, FIG. 4 and FIG. 5.

Process 1 (see FIG. 1A), Process 2 (see FIG. 1B) and Process 3 (see FIG. 10): Same as Process 1 to Process 3 of the first embodiment.

Process 4 (see FIG. 4A): Without using an adhesive, the light scattering member 21 having a flat surface is directly fixed to the entire surface on the front side of the luminescent color conversion member 14.

The light scattering member 21 is formed by a translucent material (e.g., a sintered body of a glass, a thermoplastic resin material, a thermosetting resin material, and a transparent inorganic material such as a sol-gel glass and alumina, etc.). The translucent material contains a light scattering material (e.g., silica, titanium oxide, etc.) for scattering the emitted light of the LED chip 15.

Meanwhile, the light scattering member 21 may be formed by the translucent material in which voids (bubbles) for scattering the emitted light of the LED chip 15 are formed.

When the translucent material is a sintered body of a transparent inorganic material or a glass, voids that are naturally produced during firing can be used. Accordingly, it is possible to improve productivity.

Furthermore, since the light scattering member 21 having voids formed therein can be easily broken, the light scattering member 21 can be easily divided in Process 5 to be described later.

A method of forming the light scattering member 21 can be properly selected, depending on the translucent material forming the light scattering member 21.

Here, the formation temperature of the light scattering member 21 needs to be equal to or less than the formation temperature of the luminescent color conversion member 14 so that a process of forming the light scattering member 21 does not adversely affect the luminescent color conversion member 14.

Further, in order to prevent the light scattering member 21 from being separated from the luminescent color conversion member 14, it is desirable that the material having the same thermal expansion coefficient as the translucent material forming the luminescent color conversion member 14 is used as the translucent material forming the light scattering member 21. For example, the light scattering member 21 and the luminescent color conversion member 14 can be formed by the same translucent material.

Further, in order to improve the light extraction efficiency of the light emitting device 20, it is desirable that the refractive index of the light scattering member 21 is equal to or greater than 1.5 but is lower than the refractive index of the luminescent color conversion member 14.

Process 5 (see FIG. 4B): The stack of the crystal growth substrate 11, the semiconductor layer 12, the luminescent color conversion member 14 and the light scattering member 21 is divided and segmented into a plurality of chips by a scribe dicing. In this way, the LED chips 15 are manufactured, and in each of the LED chips 15, the luminescent color conversion member 14 and the light scattering member 21 are directly fixed in this order to the light emitting surface.

Process 6 (see FIG. 4C): The LED chip 15 is mounted/carried on the front surface side of the mounting substrate 16.

Process 7 (see FIG. 5A): The reflective member 17 is formed on the front surface of the mounting substrate 16.

The reflective member 17 surrounds and covers the LED chip 15, the luminescent color conversion member 14 and the light scattering member 21. The reflective member 17 is in close contact with the side surfaces of the LED chip 15, the luminescent color conversion member 14 and the light scattering member 21. The reflective member 17 covers the upper surface of the luminescent light scattering member 21.

At this time, the formation temperature of the reflective member 17 needs to be equal to or less than the formation temperature of the luminescent color conversion member 14 and the light scattering member 21 so that a process of forming the reflective member 17 does not adversely affect the luminescent color conversion member 14 and the light scattering member 21.

Process 8 (see FIG. 5B): The reflective member 17 is polished to expose a front surface of the light scattering member 21. Then, the front surface of the light scattering member 21 is flush with the front surface of the reflective member 17. In this way, the light emitting device 20 is completed.

At this time, by polishing the light scattering member 21 to a predetermined thickness, simultaneously with the polishing of the reflective member 17, the light scattering member 21 may be adjusted to give a desired light scattering effect.

In the case of simultaneously polishing the reflective member 17 and the light scattering member 21, it is preferable to form the reflective member 17 and the light scattering member 21 by the same translucent material. By doing so, the reflective member 17 and the light scattering member 21 are uniformly polished so that the front surface of the light scattering member 21 is flush with the front surface of the reflective member 17.

Meanwhile, in the case of simultaneously polishing the reflective member 17 and the light scattering member 21, it is not necessary to flatten the front surface of the light scattering member 21 in Process 4.

In the second embodiment, the light scattering member 21 is provided to cover the luminescent light conversion member 14. Accordingly, in addition to the above operation/effects of the first embodiment, the in-plane distribution of chromaticity in the front surface (light emitting surface of the light emitting device 20) of the light scattering member 21 can be made uniform. As a result, it is possible to further improve the effect of suppressing the chromaticity unevenness in the light emitting surface of the light emitting device 20.

Third Embodiment

A manufacturing method of a light emitting device 30 of a third embodiment will be described with reference to FIGS. 1A to 1D, FIG. 2A and FIGS. 6A to 6B.

Process 1 (see FIG. 1A), Process 2 (see FIG. 1B), Process 3 (see FIG. 10), Process 4 (see FIG. 10) and Process 5 (see FIG. 2A): Same as Process 1 to Process 5 of the first embodiment.

Process 6 (see FIG. 6A): A reflective member 31 is formed on the front surface of the mounting substrate 16.

The reflective member 31 has a double layer structure where a light reflective layer 31a and a light absorption layer 31b are laminated. The reflective member 31 has an insulating property.

The light reflective layer 31a surrounds the luminescent color conversion member 14 and the LED chip 15 and is in close contact with the side surfaces thereof.

The light absorption layer 31b surrounds the luminescent color conversion member 14. The light absorption layer 31b is in close contact with the vicinity of the upper end of the side surface of the luminescent color conversion member 14. The light absorption layer 31b covers the upper surface of the luminescent color conversion member 14.

Similarly to the reflective member 17, the light reflective layer 31a is formed the translucent material (e.g., a glass, a thermoplastic resin material, a thermosetting resin material, a sol-gel glass, etc.) containing the light reflective material for reflecting the emitted light of the LED chip 15.

The light absorption layer 31b is formed the translucent material (e.g., a glass, a thermoplastic resin material, a thermosetting resin material, a sol-gel glass, etc.) containing a light absorption material (e.g., black pigment, etc.) for absorbing the emitted light of the LED chip 15.

A method of forming the reflective member 31 can be properly selected, depending on the translucent material forming the reflective member 31.

When the reflective member 31 is made of a glass or a thermoplastic resin material, a plate-like glass or thermoplastic resin material can be thermally pressed to the LED chip 15 and the mounting substrate 16.

Here, as the plate-like glass or thermoplastic resin material, a double layer structure where the light reflective layer 31a and the light absorbing layer 31b are laminated in advance can be employed.

When the reflective member 31 is made of the thermosetting resin material, various coating methods can be used to coat a liquid-phase thermosetting resin material for forming the light reflective layer 31a on the LED chip 15 and the mounting substrate 16. Then, the thermosetting resin material can be cured. Subsequently, the liquid-phase thermosetting resin material for forming the light absorbing layer 31b can be coated on the LED chip 15 and the mounting substrate 16. Then, the thermosetting resin material can be cured.

When the reflective member 31 is made of the sol-gel glass, various coating methods can be used to coat a liquid-phase sol-gel glass forming material for forming the light reflective layer 31a on the LED chip 15 and the mounting substrate 16. Then, the sol-gel glass can be formed in the manner described above. Subsequently, a liquid-phase sol-gel glass forming material for forming the light absorbing layer 31b can be coated on the LED chip 15 and the mounting substrate 16. Then, the sol-gel glass can be formed in the manner described above.

Process 7 (see FIG. 3): The light absorbing layer 31b of the reflective member 31 is polished to expose the front surface of the luminescent color conversion member 14. Then, the front surface of the luminescent color conversion member 14 is flush with the front surface of the light absorbing layer 31b. In this way, the light emitting device 30 is completed.

In the third embodiment, unwanted stray light other than the light emitted in a direction perpendicular to the light emitting surface of the LED chip 15 is absorbed by the light absorbing layer 31b of the reflective member 31. Accordingly, in addition to the above operation/effects of the first embodiment, the light can be emitted only in the direction perpendicular to the light emitting surface of the LED chip 15, so that it is possible to realize the light emitting device 30 suitable for a headlamp of a vehicle, especially.

Meanwhile, in the third embodiment, the light absorbing layer 31b may be configured to cover not only the vicinity of the upper end of the side surface of the luminescent color conversion member 14 but also the entire side surface of the luminescent color conversion member 14 and further the side surface of the LED chip 15.

In this way, the stray light can be further effectively absorbed/shielded.

Further, the light reflective layer 31a may be omitted from the reflective member 31. The reflective member 31 may be configured only by the light absorbing layer 31b. In other words, the entire of the reflective member 31 may be substituted with a light absorbing material.

Fourth Embodiment

A manufacturing method of the light emitting device 10 according to a fourth embodiment will be described with reference to FIGS. 7A to 7C and FIGS. 8A to 8B.

The fourth embodiment provides a manufacturing method of simultaneously manufacturing a plurality of light emitting devices 10 of the first embodiment.

Process 1 (see FIG. 7A): A plurality of (nine in the illustrated example) LED chips 19 is mounted/carried in a grid pattern on the front surface of the mounting substrate 16. Meanwhile, the luminescent color conversion member 14 is directly fixed to the upper surfaces of the LED chips 15.

Process 2 (see FIG. 7B): A plurality of (three in the illustrated example) rectangular reflective members 17 is formed on the front surface of the mounting substrate 16. The LED chips 15 arranged side by side in a row are covered by one reflective member 17.

Process 3 (see FIG. 7C): The reflective member 17 is polished to expose the front surface of the luminescent color conversion member 14. Then, the front surface of the luminescent color conversion member 14 is flush with the front surface of the reflective member 17.

Process 4 (see FIG. 8A and FIG. 8B): The stack of the crystal growth substrate 11, the semiconductor layer 12, the luminescent color conversion member 14 and the reflective member 17 is divided into a plurality of segments along scribe lines SL by a scribe dicing. In this way, a plurality of (nine in the illustrated example) light emitting devices 10 are simultaneously manufactured.

Fifth Embodiment

Figure 9A:
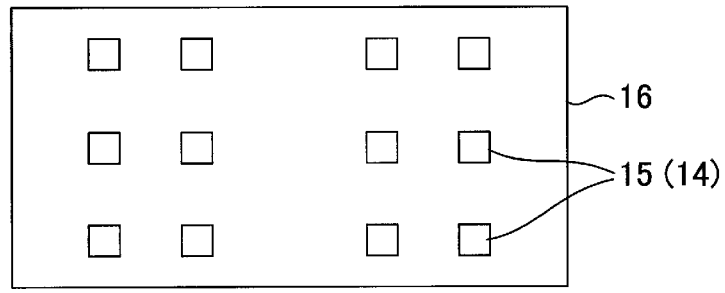
FIGS. 9A to 9C are plan views for explaining a manufacturing method of a light emitting device 40 of a fifth embodiment of the present invention.
Figure 9B:
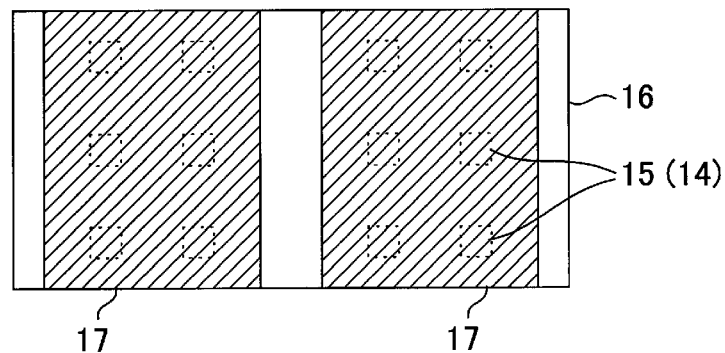
Figure 9C:
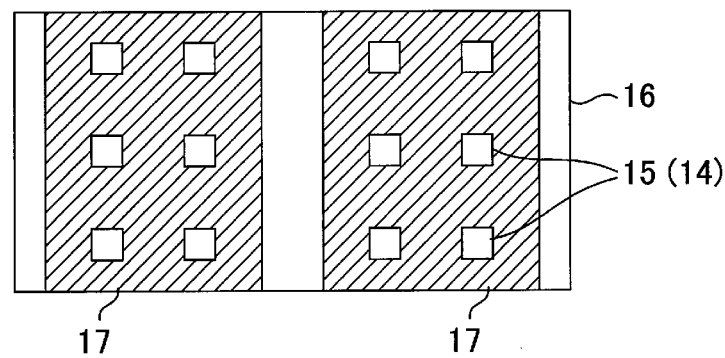

A manufacturing method of a light emitting device 40 according to a fifth embodiment will be described with reference to FIG. 9 and FIG. 10.

Figure 3:
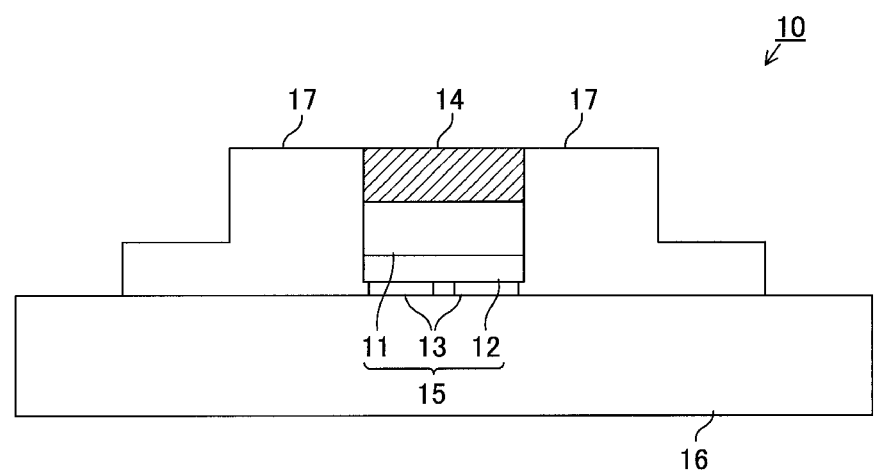
FIG. 3 is a longitudinal sectional view for explaining the manufacturing method of the light emitting device 10.
Figure 10B:
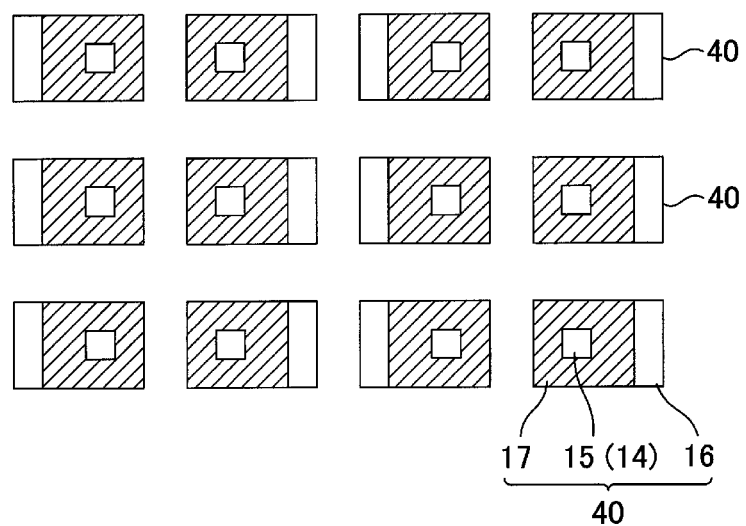
Figure 11:
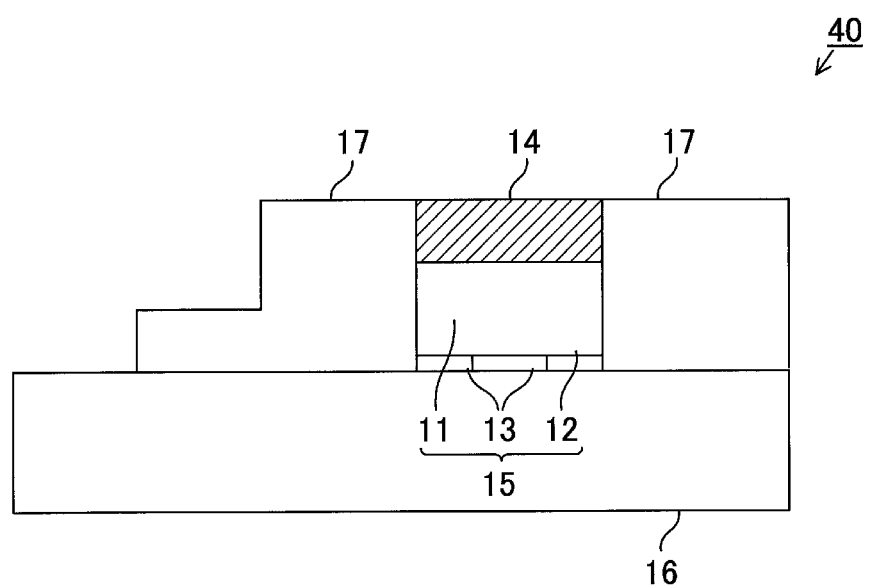
FIG. 11 is a longitudinal sectional view for explaining a manufacturing method of the light emitting device 40.

As shown in FIG. 10B, the light emitting device 40 of the fifth embodiment is different from the light emitting device 10 of the first embodiment shown in FIG. 3 only in its appearance.

Process 1 (see FIG. 9A): A plurality of (twelve in the illustrated example) LED chips 19 are mounted/carried in a grid pattern at the front surface side of the mounting substrate 16. Meanwhile, the luminescent color conversion member 14 is directly fixed to the upper surfaces of the LED chips 15.

Process 2 (see FIG. 9B): A plurality of (two in the illustrated example) rectangular reflective members 17 are formed on the front surface of the mounting substrate 16. The LED chips 15 arranged side by side in two rows are covered by one reflective member 17.

Process 3 (see FIG. 9C): The reflective member 17 is polished to expose the front surface of the luminescent color conversion member 14. Then, the front surface of the luminescent color conversion member 14 is flush with the front surface of the reflective member 17.

Process 4 (see FIG. 10A and FIG. 10B): The stack of the crystal growth substrate 11, the semiconductor layer 12, the luminescent color conversion member 14 and the reflective member 17 is divided into a plurality of segments along scribe lines SL by a scribe dicing. In this way, a plurality of (twelve in the illustrated example) light emitting devices 40 are simultaneously manufactured.

Other Embodiments

The present invention is not limited to each of the above-described embodiments but may be embodied as follows. Also in these cases, it is possible to obtain the operation/effects equal to or better than each of the above-described embodiments.

[A] In each of the above embodiments, the plate-like light emitting element group where a plurality of LED chips 15 (light emitting elements) are arranged in a planar direction is configured by the crystal growth substrate 11, the semiconductor layer 12 and the electrodes 13.

Meanwhile, the crystal growth substrate 11 may be removed when it does not constitute the light emitting element structure. A proper support substrate may be bonded to the semiconductor layer 12 where the crystal growth substrate 11 is removed. Further, the luminescent color conversion member 14 may be used as the support substrate.

[B] The LED chips 15 may be substituted with any semiconductor light emitting element (e.g., EL (Electro Luminescence) element, etc.).

[C] The present invention may be implemented by appropriately combining each of the embodiments. In this case, the operation/effects of the combined embodiments can be additionally obtained or synergy effects can be obtained.

The present invention is not limited to the description of respective illustrative embodiments and each of the aspects. The present invention also includes various modifications which can be easily conceived by those skilled in the art without departing from the description of the claims. The contents of publications mentioned in the present specification are incorporated by reference in its entity.

What is claimed is:

1. A method of manufacturing a light emitting device, the method comprising:
   manufacturing a plate-like light emitting element group where a plurality of light emitting elements are arranged in a plane direction;
   directly fixing a luminescent color conversion member to a light emitting surface side of the light emitting elements in the light emitting element group, the luminescent color conversion member comprising a translucent material including phosphors;
   dividing, a stack of the light emitting element group and the luminescent color conversion member, into a plurality of chips to manufacture the light emitting elements, wherein, in each of the light emitting elements, a piece of the luminescent color conversion member is directly fixed to a light emitting surface of the light emitting element;
   mounting the light emitting element on a front surface of a mounting substrate;
   forming a reflective member including a light reflective material on the front surface of the mounting substrate, and surrounding and covering the light emitting element and the piece of the luminescent color conversion member by the reflective member; and
   manufacturing the light emitting device by polishing the reflective member to expose a front surface of the piece of the luminescent color conversion member and causing the front surface of the piece of the luminescent color conversion member to be flush with a front surface of the reflective member.

2. The method of manufacturing the light emitting device according to claim 1, wherein the reflective member includes a double layer structure where a light reflective layer comprising a translucent material including a light reflective material and a light absorbing layer comprising a translucent material including a light absorbing material are stacked,
   wherein the light reflective layer surrounds the light emitting element so as be in contact with a side surface of the light emitting element, and
   wherein the light absorbing layer surrounds the piece of the luminescent color conversion member so as to be in contact with a side surface of the piece of the luminescent color conversion member.

3. The method of manufacturing the light emitting device according to claim 1, wherein said dividing the stack of the light emitting element group and the luminescent color conversion member is conducted after said directly fixing the luminescent color conversion member to the light emitting surface side of the light emitting elements.

4. The method of manufacturing the light emitting device according to claim 3, wherein said dividing the stack of the light emitting element group and the luminescent color conversion member is conducted before said mounting the light emitting element on the front surface of the mounting substrate.

5. The method of manufacturing the light emitting device according to claim 4, wherein said forming the reflective member is conducted after said mounting the light emitting element on the front surface of the mounting substrate.

6. The method of manufacturing the light emitting device according to claim 1, wherein said dividing the stack of the light emitting element group and the luminescent color conversion member is conducted before said mounting the light emitting element on the front surface of the mounting substrate.

7. The method of manufacturing the light emitting device according to claim 6, wherein said forming the reflective member is conducted after said mounting the light emitting element on the front surface of the mounting substrate.

8. The method of manufacturing the light emitting device according to claim 1, wherein said forming the reflective member is conducted after said dividing the stack of the light emitting element group and the luminescent color conversion member.

9. The method of manufacturing the light emitting device according to claim 1, wherein said forming the reflective member comprises disposing the light reflective material on an upper surface of the luminescent color conversion member.

10. The method of manufacturing the light emitting device according to claim 1, wherein, in said forming the reflective member, the light reflective material is disposed to abut an upper surface of the luminescent color conversion member.

11. The method of manufacturing the light emitting device according to claim 1, wherein an entirety of the luminescent color conversion member includes a single layer.

12. The method of manufacturing the light emitting device according to claim 1, wherein the luminescent color conversion member includes a single layer that extends from the light emitting surface side of the light emitting elements to the front surface of the piece of the luminescent color conversion member.

13. A method of manufacturing a light emitting device, the method comprising:
   manufacturing a plate-like light emitting element group where a plurality of light emitting elements are arranged in a plane direction;
   directly fixing a luminescent color conversion member to a light emitting surface side of the light emitting elements in the light emitting element group, the luminescent color conversion member comprising a translucent material including phosphors;
   directly fixing a light scattering member to the luminescent color conversion member, the light scattering member comprising a translucent material including a light scattering material;
   dividing, a stack of the light emitting element group, the luminescent color conversion member and the light scattering member, into a plurality of chips to manufacture the light emitting elements, wherein, in each of the light emitting elements, a piece of the luminescent color conversion member and a piece of the light scattering member are directly fixed in this order to a light emitting surface of a light emitting element;
   mounting the light emitting element on a front surface of a mounting substrate;
   forming a reflective member including a light reflective material on the front surface of the mounting substrate, and surrounding and covering the light emitting element, the piece of the luminescent color conversion member and the piece of the light scattering member by the reflective member; and manufacturing the light emitting device by polishing the reflective member to expose a front surface of the piece of the luminescent color conversion member and causing a front surface of the reflective member to be flush with the front surface of the piece of the light scattering member.

14. The method of manufacturing the light emitting device according to claim 13, wherein the reflective member includes a double layer structure where a light reflective layer comprising a translucent material including a light reflective material and a light absorbing layer comprising a translucent material including a light absorbing material are stacked,
wherein the light reflective layer surrounds the light emitting element so as be in contact with a side surface of the light emitting element, and
wherein the light absorbing layer surrounds the piece of the luminescent color conversion member so as to be in contact with a side surface of the piece of the luminescent color conversion member.

15. The method of manufacturing the light emitting device according to claim 2, wherein said dividing is conducted after said directly fixing the light scattering member to the luminescent color conversion member.

16. The method of manufacturing the light emitting device according to claim 15, wherein said dividing is conducted before said mounting the light emitting element on the front surface of the mounting substrate.

17. The method of manufacturing the light emitting device according to claim 16, wherein said forming the reflective member is conducted after said mounting the light emitting element on the front surface of the mounting substrate.

18. The method of manufacturing the light emitting device according to claim 13, wherein said forming the reflective member comprises disposing the light reflective material on an upper surface of the piece of the light scattering member.

19. The method of manufacturing the light emitting device according to claim 13, wherein, in said forming the reflective member, the light reflective material is disposed to abut an upper surface of the piece of the light scattering member.

20. The method of manufacturing the light emitting device according to claim 13, wherein the luminescent color conversion member includes a single layer that extends from the light emitting surface side of the light emitting elements to a bottom surface of the piece of the light scattering member.

* * * * *